(12) United States Patent
Cheng

(10) Patent No.: US 12,300,725 B2
(45) Date of Patent: May 13, 2025

(54) ENHANCEMENT-MODE SEMICONDUCTOR DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 580 days.

(21) Appl. No.: 17/554,158

(22) Filed: Dec. 17, 2021

(65) Prior Publication Data

US 2022/0199780 A1 Jun. 23, 2022

(30) Foreign Application Priority Data

Dec. 17, 2020 (CN) .......................... 202023057904.8

(51) Int. Cl.
  *H01L 29/78* (2006.01)
  *H01L 29/10* (2006.01)
  *H01L 29/20* (2006.01)
  *H01L 29/205* (2006.01)
  *H01L 29/778* (2006.01)

(52) U.S. Cl.
  CPC ...... *H01L 29/2003* (2013.01); *H01L 29/1066* (2013.01); *H01L 29/205* (2013.01); *H01L 29/7786* (2013.01)

(58) Field of Classification Search
  CPC ............. H01L 29/1066; H01L 29/1075; H01L 29/2003; H01L 29/205; H01L 29/42316; H01L 29/7786; H01L 29/7789; H01L 29/42356; H01L 29/7813; H01L 29/7825; H01L 29/66613; H01L 29/66621; H01L 29/66628; H01L 29/42336; H01L 29/42352; H01L 29/4236; H01L 29/1037
  See application file for complete search history.

(56) References Cited

U.S. PATENT DOCUMENTS

| | | | |
|---|---|---|---|
| 9,570,436 B2 * | 2/2017 | Nakajima | H01L 29/7835 |
| 2011/0210377 A1 * | 9/2011 | Haeberlen | H01L 27/0605 |
| | | | 257/E21.403 |
| 2012/0181548 A1 * | 7/2012 | Okada | H01L 29/66462 |
| | | | 257/E29.246 |
| 2013/0316507 A1 * | 11/2013 | Saitoh | H01L 29/7788 |
| | | | 438/285 |
| 2014/0264369 A1 * | 9/2014 | Padmanabhan | H01L 27/0688 |
| | | | 438/172 |

(Continued)

*Primary Examiner* — Benjamin P Sandvik
(74) *Attorney, Agent, or Firm* — Westbridge IP LLC

(57) ABSTRACT

Disclosed is an enhancement-mode semiconductor device, comprising: a substrate; a p-type semiconductor layer, the p-type semiconductor layer being disposed on the substrate; an n-type semiconductor layer, the n-type semiconductor layer being disposed on the p-type semiconductor layer, a groove being formed in a gate region of the n-type semiconductor layer, and the first groove penetrating the n-type semiconductor layer; a channel layer, the channel layer being conformally disposed on the n-type semiconductor layer and in the first groove; and a barrier layer, the barrier layer being conformally disposed on the channel layer. The enhancement-mode semiconductor device has a simple structure, a good repeatability, and avoids bringing impurities and defects to the channel layer and the barrier layer.

9 Claims, 2 Drawing Sheets

(56) References Cited

U.S. PATENT DOCUMENTS

2018/0350917 A1* 12/2018 Ujita ................. H01L 29/42356
2018/0350965 A1* 12/2018 Shibata ............... H01L 29/7789
2021/0210627 A1*  7/2021 Moens ................ H01L 29/4236
2022/0059660 A1*  2/2022 Shibata ............... H01L 29/7789
2024/0162298 A1*  5/2024 He ..................... H01L 29/7789

* cited by examiner

ENHANCEMENT-MODE SEMICONDUCTOR DEVICE

CROSS-REFERENCE TO RELATED APPLICATIONS

This application claims priority to Chinese Patent Application No. 202023057904.8 filed on Dec. 17, 2020, which is hereby incorporated by reference in its entirety.

TECHNICAL FIELD

This application relates to the field of semiconductors, and in particular to an enhancement-mode semiconductor device.

BACKGROUND

Wide bandgap semiconductor materials represented by GaN have relatively high saturation electron velocities and wide band gaps.

Enhancement-mode devices of GaN-based materials have a wide range of applications in high-voltage switches and high-speed radio frequency circuits. In the prior art, in order to realize an enhancement-mode device, the commonly used technical solutions include: reducing the thickness of the barrier layer; etching a part of the barrier layer under the gate; implanting fluorine ions in the region of the barrier layer under the gate; disposing p-type semiconductors on the barrier layer under the gate, etc. However, these methods have shortcomings. Thinning the barrier layer will reduce the concentration of two-dimensional electron gas in the entire channel region, resulting in a small saturation current of the device. It is difficult to control the etching depth when etching the part of the barrier layer under the gate, and the etching damage leads to a large gate leakage current. It is difficult to achieve high threshold voltage by implanting fluoride ions in the region under the gate, and the stability of fluoride ions is not good, which has an impact on the reliability of the device under high-voltage and high-temperature. Setting p-type semiconductors under the gate requires to etch the p-type semiconductors except the gate region, it is very difficult to achieve precise control of the etching thickness so as not to cause losses to the barrier layer, and the defects caused by the etching and the magnesium atoms remaining in p-type aluminum gallium nitride can cause severe current collapse effects.

SUMMARY

In view of this, this application provides an enhancement-mode semiconductor device to solve the problem of unstable device performance caused by etching p-type semiconductors.

The purpose of this application is to provide an enhancement-mode semiconductor device, comprising:
a substrate;
a p-type semiconductor layer, the p-type semiconductor layer being disposed on the substrate;
an n-type semiconductor layer, the n-type semiconductor layer being disposed on the p-type semiconductor layer, a groove being formed in a gate region of the n-type semiconductor layer, and the first groove penetrating the n-type semiconductor layer;
a channel layer, the channel layer being conformally disposed on the n-type semiconductor layer and in the first groove; and
a barrier layer, the barrier layer being conformally disposed on the channel layer.

As an optional technical solution, the enhancement-mode semiconductor device further includes:
a source located in a source region of the barrier layer, a gate located in a gate region of the barrier layer, and a drain located in a drain region of the barrier layer.

As an optional technical solution, the p-type semiconductor layer, the n-type semiconductor layer, the channel layer, and the barrier layer are made of GaN-based materials.

As an optional technical solution, a thickness of the n-type semiconductor layer is 12-20 nm.

As an optional technical solution, the enhancement-mode semiconductor device further includes an unintentionally doped nitride layer, wherein the unintentionally doped nitride layer is located on the p-type semiconductor layer, the first groove penetrates the n-type semiconductor layer so that a gate region of the unintentionally doped nitride layer is exposed.

In the enhancement-mode semiconductor device disclosed in this application, the p-type semiconductor layer is activated in the gate region, and the two-dimensional electron gas of the channel layer and the barrier layer in the gate region can be depleted, thereby realizing the enhancement-mode device.

The enhancement-mode semiconductor device disclosed in this application avoids impurities and defects brought to the barrier layer by disposing the p-type semiconductor layer under the channel layer, so that it can have a more stable and uniform threshold voltage, and there is no need to worry about the problem that the etching depth needs to be precisely controlled when etching the groove in order to avoid etching loss caused to the barrier layer.

In the enhancement-mode semiconductor device disclosed in this application, the disposition of the n-type semiconductor layer can play a good role in protecting the subsequent channel layer. The p-type impurity elements doped in the p-type semiconductor layer will diffuse into the subsequently prepared semiconductor layers. Disposing the n-type semiconductor layer can play a good buffering role to prevent p-type impurity elements in the p-type semiconductor layer from entering the channel layer and affecting the concentration of the two-dimensional electron gas in the channel layer and the working performance of the device.

In the enhancement-mode semiconductor device disclosed in this application, the groove is disposed in the gate region of the n-type semiconductor layer, so that the p-type semiconductor is activated only in the gate region. The process is simple, the repeatability is good, and the etching area is small, which reduces the influence of etching loss on the subsequent channel layer.

In order to make the above-mentioned and other objects, features and advantages of this application more obvious and easier to understand, the preferred embodiments are hereinafter described in detail together with the accompanying drawings.

DETAILED DESCRIPTION OF THE EMBODIMENTS

Figure 1:
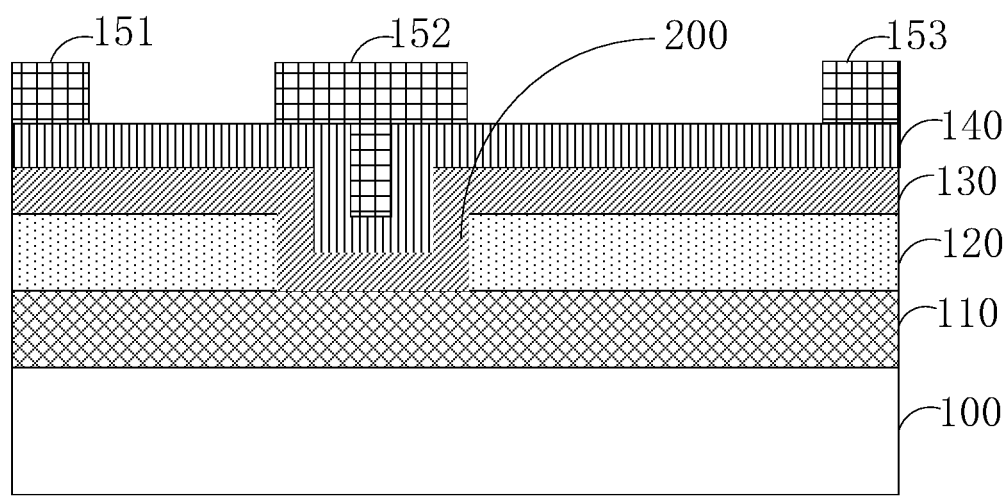
FIG. 1 is a schematic structural diagram of an enhancement-mode semiconductor device according to a first embodiment of this application.

The technical solutions in the embodiments of this application will be clearly and completely described below with reference to the drawings in the embodiments of this application. Apparently, the described embodiments are only a part of the embodiments of this application, rather than all the embodiments. Based on the embodiments in this application, all other embodiments obtained by those of ordinary skill in the art without creative efforts shall fall within the protection scope of this application.

It should be noted that like numerals and letters refer to like items in the following figures, so once an item is defined in one figure, it does not require further definition and explanation in subsequent figures. Meanwhile, in the description of this application, the terms "first", "second", etc. are only used to distinguish the description, and cannot be understood as indicating or implying relative importance. In the description of the embodiments of this application, it will be understood that when a layer (or film), region, pattern or structure is referred to as being "on" or "under" another substrate, another layer (or film), another region, another pad or another pattern, it may be "directly" or "indirectly" on another substrate, layer (or film), region, pad or pattern, or there may also be one or more intermediate layers. Such a position of the layers has been described with reference to the drawings. The thickness and size of each layer shown in the drawings may be exaggerated, omitted or schematically drawn for the purpose of convenience or clarity. In addition, the dimensions of the elements do not fully reflect the actual sizes.

FIG. 1 is a schematic structural diagram of an enhancement-mode semiconductor device according to a first embodiment of this application. As shown in FIG. 1, the enhancement-mode semiconductor device according to the first embodiment of this application includes: a substrate 100, a p-type semiconductor layer 110, an n-type semiconductor layer 120, a channel layer 130, a barrier layer 140, a source 151, a gate 152, and a drain 153. The p-type semiconductor layer 110 is disposed on the substrate 100, the n-type semiconductor layer 120 is disposed on the p-type semiconductor layer 110. A first groove 200 is formed in a gate region of the n-type semiconductor layer 120. The first groove 200 penetrates through the n-type semiconductor layer 120. The channel layer 130 is conformally disposed on the n-type semiconductor layer 120 and in the first groove 200. The barrier layer 140 is conformally disposed on the channel layer 130.

The p-type semiconductor layer 110 contains p-type impurity elements, and the p-type impurity elements are in a passivation state. The substrate 100 includes Si, sapphire, SiC, gallium nitride, etc. The material of the substrate 100 is not particularly limited in this application. The p-type semiconductor layer 110 is made of a GaN-based material, and the GaN-based material described in this application refers to a material containing at least Ga and N atoms. The p-type impurity elements include Mg.

Hydrogen gas is used in a preparation process of the p-type semiconductor layer 110, and H atoms will form Mg—H bonds with Mg, which makes the p-type impurity elements be in a passivation state, so that the p-type semiconductor layer 110 cannot effectively form holes, which requires Mg to be activated by an activation process so as to make H atoms overflow.

The n-type semiconductor layer 120 located on the p-type semiconductor layer 110 contains n-type impurity elements including Si. The n-type semiconductor layer 120 is made of a GaN-based material. The thickness of the n-type semiconductor layer can be, for example, 8-20 nm, preferably 12-20 nm.

The gate region of the n-type semiconductor layer 120 has the first groove 200 to expose the gate region of the p-type semiconductor layer 110. It should be understood that the gate region defined in this application refers to a region corresponding to the gate in each semiconductor layer, which may be determined according to the designed gate position. The n-type doped n-type semiconductor layer 120 can prevent the overflow of H atoms, so only the H atoms in the gate region of the p-type semiconductor layer 110 that is not covered by the n-type semiconductor layer 120 can overflow, that is, only the p-type impurity elements in the gate region of the p-type semiconductor layer 110 can be activated.

The channel layer 130 and the barrier layer 140 are located above the n-type semiconductor layer 120. The channel layer 130 and the barrier layer 140 may be made of GaN-based materials. The channel layer 130 may contain, for example, GaN, and the barrier layer 140 may contain, for example, AlGaN.

The source 151 is located over the source region of the barrier layer 140. The gate 152 is located over the gate region of the barrier layer 140. The drain 153 is located over the drain region of the barrier layer 140.

In the enhancement-mode semiconductor device disclosed in this application, the gate region of the p-type semiconductor layer 110 is activated, which can deplete the two-dimensional electron gas of the gate regions of the channel layer 130 and the barrier layer 140, thereby realizing the enhancement-mode device.

The enhancement-mode semiconductor device disclosed in this application avoids bringing impurities and defects to the barrier layer by disposing the p-type semiconductor layer under the channel layer, so that it can have a more stable and uniform threshold voltage, and there is no need to worry about the problem that the etching depth needs to be precisely controlled when etching the groove in order to avoid etching loss caused to the barrier layer.

In the enhancement-mode semiconductor device disclosed in this application, the disposition of the n-type semiconductor layer can play a good role in protecting the subsequent channel layer. The p-type impurity elements doped in the p-type semiconductor layer will diffuse into the subsequently prepared semiconductor layers. Disposing the n-type semiconductor layer can play a good buffering role to prevent p-type impurity elements in the p-type semiconductor layer from entering the channel layer and affecting the concentration of the two-dimensional electron gas in the channel layer and the working performance of the device.

In the enhancement-mode semiconductor device disclosed in this application, the first groove is disposed in the gate region of the n-type semiconductor layer, so that the p-type semiconductor layer 110 is activated only in the gate region. The process is simple, the repeatability is good, and the etching area is small, which reduces the influence of etching loss on the subsequent channel layer, and at the same time, the existence of the first groove can reduce the concentration of the two-dimensional electron gas in the gate region.

Figure 2:
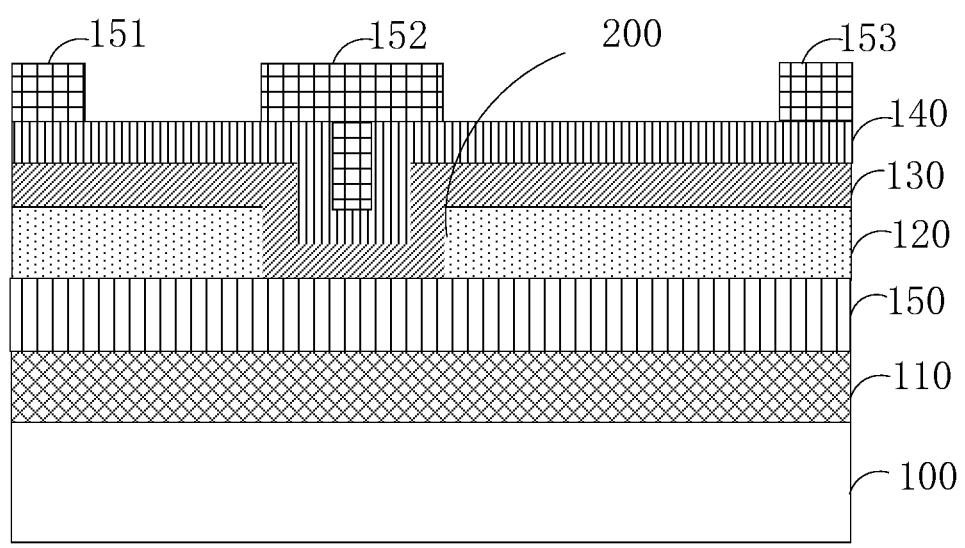
FIG. 2 is a schematic structural diagram of the enhancement-mode semiconductor device according to a second embodiment of this application.

FIG. 2 is a schematic structural diagram of an enhancement-mode semiconductor device according to a second embodiment of this application, which is substantially the same as the structure of the enhancement-mode semiconductor device according to the first embodiment. The differences are that, as shown in FIG. 2, the enhancement-mode semiconductor device according to the second embodiment comprises an unintentionally doped nitride layer 150, which is located on the p-type semiconductor layer 110. The first groove 200 penetrates the n-type semiconductor layer 120 and exposes the gate region of the unintentionally doped nitride layer 150.

"Unintentionally doped" means that the nitride layer 150 is not artificially doped. The unintentionally doped nitride layer 150 includes a GaN-based material. The p-type semiconductor layer 110 contains p-type impurity elements with high doping concentrations, and the p-type impurity elements in the p-type semiconductor layer 110 diffuse to the unintentionally doped nitride layer 150 that is immediately adjacent to it. In this way, it is guaranteed that a certain doping concentration is maintained at the surface of the unintentionally doped nitride layer 150 away from the p-type semiconductor layer 110, and the nitride layer 150 having an ideal doping concentration can be obtained, which prevents the p-type impurity elements from diffusing into the channel layer 130.

The above descriptions are only preferred embodiments of this application and are not intended to limit this application. For those skilled in the art, this application may have various modifications and changes. Any modification, equivalent replacement, improvement, etc. made within the spirit and principle of this application shall be included within the protection scope of this application.

What is claimed is:

1. An enhancement-mode semiconductor device, comprising:
   a substrate;
   a p-type semiconductor layer, the p-type semiconductor layer being disposed on the substrate;
   an n-type semiconductor layer, the n-type semiconductor layer being disposed on the p-type semiconductor layer, a groove being formed in a gate region of the n-type semiconductor layer, and the first groove penetrating the n-type semiconductor layer;
   a channel layer, the channel layer being conformally disposed on the n-type semiconductor layer and in the first groove;
   a barrier layer, the barrier layer being conformally disposed on the channel layer; and
   an unintentionally doped nitride layer, wherein the unintentionally doped nitride layer is located on the p-type semiconductor layer, and the first groove penetrates the n-type semiconductor layer so that a gate region of the unintentionally doped nitride layer is exposed,
   wherein both the p-type semiconductor layer and the unintentionally doped nitride layer contain p-type impurity elements, and a doping concentration of the p-type impurity elements at a surface of the unintentionally doped nitride layer away from the p-type semiconductor layer is less than a doping concentration of the p-type impurity elements in the p-type semiconductor layer.

2. The enhancement-mode semiconductor device of claim 1, further comprising:
   a source located in a source region of the barrier layer, a gate located in a gate region of the barrier layer, and a drain located in a drain region of the barrier layer.

3. The enhancement-mode semiconductor device of claim 1, wherein the p-type semiconductor layer, the n-type semiconductor layer, the channel layer, and the barrier layer are made of GaN-based materials.

4. The enhancement-mode semiconductor device of claim 1, wherein a thickness of the n-type semiconductor layer is 12-20 nm.

5. The enhancement-mode semiconductor device of claim 1, wherein the substrate is a Si substrate, a sapphire substrate, a SiC substrate, or a gallium nitride substrate.

6. The enhancement-mode semiconductor device of claim 1, wherein the p-type semiconductor layer contains p-type impurity elements.

7. The enhancement-mode semiconductor device of claim 6, wherein the p-type impurity elements include Mg.

8. The enhancement-mode semiconductor device of claim 6, wherein the p-type impurity elements in a region of the p-type semiconductor layer corresponding to the first groove are activated.

9. The enhancement-mode semiconductor device of claim 6, wherein the p-type impurity elements in a region of the p-type semiconductor layer that is covered by the n-type semiconductor layer are in a passivation state.

* * * * *